US012628359B2

(12) United States Patent
Han et al.

(10) Patent No.: US 12,628,359 B2
(45) Date of Patent: May 12, 2026

(54) DEEP TRENCH CAPACITOR AND METHOD OF MANUFACTURING SAME

(71) Applicant: DB HiTek Co., Ltd., Bucheon-si (KR)

(72) Inventors: Chang Hun Han, Icheon-si (KR); Man Lyun Ha, Mungyeong-si (KR); Tae Wook Kang, Yongin-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 409 days.

(21) Appl. No.: 18/493,076

(22) Filed: Oct. 24, 2023

(65) Prior Publication Data

US 2025/0081478 A1    Mar. 6, 2025

(30) Foreign Application Priority Data

Aug. 30, 2023    (KR) ........................ 10-2023-0114744

(51) Int. Cl.

| | |
|---|---|
| *H01L 29/94* | (2006.01) |
| *H01L 29/06* | (2006.01) |
| *H01L 29/66* | (2006.01) |
| *H10D 1/00* | (2025.01) |
| *H10D 1/66* | (2025.01) |
| *H10D 62/10* | (2025.01) |

(52) U.S. Cl.
CPC ............. *H10D 1/665* (2025.01); *H10D 1/047* (2025.01); *H10D 62/102* (2025.01)

(58) Field of Classification Search
CPC ...... H10D 1/665; H10D 1/047; H10D 62/102; H10D 1/716; H01L 21/02126; H01L 21/0223
USPC .......................................... 257/301
See application file for complete search history.

(56) References Cited

U.S. PATENT DOCUMENTS

| | | | | |
|---|---|---|---|---|
| 6,093,618 | A * | 7/2000 | Chen ................. | H01L 21/76224 438/296 |
| 6,319,794 | B1 * | 11/2001 | Akatsu .............. | H01L 21/76232 257/E21.549 |
| 2008/0315326 | A1 * | 12/2008 | Graf .................. | H01L 21/31144 257/E27.06 |
| 2023/0012211 | A1 * | 1/2023 | Jo .......................... | H01G 4/385 |

FOREIGN PATENT DOCUMENTS

KR      10-2018-0058757 A      6/2018

* cited by examiner

*Primary Examiner* — Tong-Ho Kim
(74) *Attorney, Agent, or Firm* — Bridgeway IP Law Group, PLLC; Jihun Kim

(57) ABSTRACT

Proposed are a deep trench capacitor and a method of manufacturing the same that compensate for a thin thickness in bottom corner areas of an oxide film (e.g., $SiO_2$) grown by thermal oxidation in a deep trench to prevent a deterioration in breakdown voltage characteristics due to electric field concentration in the corner areas of the oxide film, or that relatively flatten widthwise inner sidewalls of the deep trench to improve the breakdown voltage characteristics and gap-fill characteristics of a device.

19 Claims, 13 Drawing Sheets

9

910

911

903

901

915

913

DEEP TRENCH CAPACITOR AND METHOD OF MANUFACTURING SAME

CROSS REFERENCE TO RELATED APPLICATION

The present application claims priority to Korean Patent Application No. 10-2023-0114744, filed Aug. 30, 2023, the entire contents of which is incorporated herein for all purposes by this reference.

BACKGROUND OF THE INVENTION

Field of the Invention

The present disclosure relates to a deep trench capacitor and a method of manufacturing the same that improve the breakdown voltage characteristics and/or gap-fill characteristics of a device.

Description of the Related Art

Currently, the semiconductor industry has attempted to reduce the surface area of semiconductor devices in order to form more devices on the same substrate size. Vertical device structures can significantly reduce surface area requirements for semiconductor devices. One type of vertical device commonly implemented in integrated chips is a deep trench capacitor. The deep trench capacitor includes one or more capacitor electrodes extending into a trench in a semiconductor substrate. The deep trench capacitor can be used for a variety of purposes, for example, as a decoupling capacitor configured to decouple one part of an electrical circuit, such as an interconnection part, from another part of the circuit.

FIG. 1 is a reference diagram illustrating a conventional deep trench capacitor 9.

Referring to FIG. 1, in the manufacturing process of the conventional deep trench capacitor 9, $O_2$ diffuses toward an Si substrate 901 by a thermal oxidation process to form an $SiO_2$ oxide film in a deep trench 903. Here, the growth rate of the oxide film 910 varies depending on the crystal direction. In detail, the oxide film 910 may be formed such that in the deep trench 903, sidewalls 911 thereof grow relatively quickly to be formed thick and a bottom surface 913 thereof grows more slowly than the sidewalls 911 to be formed relatively thin. In addition, corner areas 915 of the oxide film 910 where the sidewalls 911 and the bottom surface 913 meet generally grow the slowest to be formed the thinnest. As a result, inner walls of the corner areas 915 of the oxide film 910 are formed in a sharp shape. Due to such a non-uniform thickness of the bottom surface 913 and the corner areas 915 of the oxide film 910, an electric field may be concentrated in the corner areas 915, causing a problem of deteriorating breakdown voltage characteristics.

To overcome the above problem, the inventors of the present disclosure have proposed a novel deep trench capacitor with an improved structure and a method of manufacturing the same, which will be described in detail later.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent Application Publication No. 10-2018-0058757 "Semiconductor devices and methods of forming the same"

SUMMARY OF THE INVENTION

Considering the aforementioned issues observed in the related art, the present disclosure aims to address these problems. One objective of the present disclosure is to provide a deep trench capacitor and a method of manufacturing the same that compensate for a thin thickness in bottom corner areas of an oxide film (e.g., $SiO_2$) grown by thermal oxidation in a deep trench, thereby preventing a deterioration in breakdown voltage characteristics due to electric field concentration in the corner areas of the oxide film.

Another objective of the present disclosure is to provide a deep trench capacitor and a method of manufacturing the same that compensate for a thin thickness in bottom corner areas of an oxide film (e.g., $SiO_2$) grown by thermal oxidation in a deep trench while relatively flattening widthwise sidewalls of the deep trench, thereby improving the breakdown voltage characteristics and gap-fill characteristics of a device.

In order to achieve the above objectives, according to one aspect of the present disclosure, there is provided a deep trench capacitor, including: a substrate having a first surface and a second surface opposite to the first surface; a trench having a predetermined depth in the substrate; a compensation film disposed on inner sidewalls and a bottom surface of the trench; an oxide film disposed on the compensation film; and a conductive layer and a dielectric layer alternately deposited on the oxide film. Here, the compensation film may be formed by a low-pressure radical process.

According to another aspect of the present disclosure, the oxide film may be formed by a thermal oxidation process and has corner areas having a thinnest thickness.

According to another aspect of the present disclosure, the compensation film may be formed substantially conformally.

According to another aspect of the present disclosure, the oxide film may have a thickness of 4 to 6 times a thickness of the compensation film.

According to another aspect of the present disclosure, the oxide film may have a thickness of 100 Å to 500 Å.

According to another aspect of the present disclosure, the compensation film may be formed conformally to have a thickness of 20 Å to 160 Å.

According to another aspect of the present disclosure, there is provided a deep trench capacitor, including: a substrate having a first surface and a second surface opposite to the first surface; a trench formed in the substrate and having inner sidewalls that are inclined as extending downwardly; an oxide film disposed on the inner walls of the trench; a planarization film disposed on the oxide film; and a conductive layer and a dielectric layer alternately deposited on the planarization film. Here, the planarization film may be formed such that in the trench, an upper portion thereof is thicker than a lower portion thereof.

According to another aspect of the present disclosure, the planarization film may be a TEOS film.

According to another aspect of the present disclosure, the planarization film may be an LP-TEOS film or a PE-TEOS film.

According to another aspect of the present disclosure, the planarization film may have an overall thickness of 200 Å to 1500 Å.

According to another aspect of the present disclosure, inner sidewalls of the planarization film may have an inclination angle between an inclination angle of the inner sidewalls of the trench and an angle of 90°.

According to another aspect of the present disclosure, there is provided a deep trench capacitor, including: a substrate having a first surface and a second surface opposite to the first surface; a deep trench having a predetermined depth in the substrate; a compensation film disposed on inner sidewalls and a bottom surface of the trench; an oxide film disposed on the compensation film; a planarization film disposed on the oxide film; and a conductive layer and a dielectric layer alternately deposited on the planarization film.

According to another aspect of the present disclosure, the compensation film may be formed by a low-pressure radical process at a pressure of 0.5 torr.

According to another aspect of the present disclosure, the compensation film may be an oxide film and may not be substantially affected by orientation of a crystal plane.

According to another aspect of the present disclosure, the oxide film may be formed such that in the deep trench, sidewalls thereof are the thickest, a bottom surface thereof is thinner than the sidewalls, and corner areas thereof where the sidewalls and the bottom surface meet are the thinnest.

According to another aspect of the present disclosure, the planarization film may be an LP-TEOS film or a PE-TEOS film.

According to another aspect of the present disclosure, there is provided a method of manufacturing a deep trench capacitor, the method including: forming a trench having a predetermined depth in a substrate; forming a compensation film along inner walls of the trench; forming an oxide film on the compensation film; and forming a conductive layer and a dielectric layer alternately on the oxide film. Here, the compensation film may be an oxide film and may be formed substantially conformally.

According to another aspect of the present disclosure, the compensation film may be formed by a low-pressure radical process.

According to another aspect of the present disclosure, the oxide film may be grown by a thermal oxidation process.

The present disclosure has the following effects by the above configuration.

According to the present disclosure, a thin thickness in bottom corner areas of an oxide film (e.g., $SiO_2$) grown by thermal oxidation in a deep trench can be compensated for, thereby preventing a deterioration in breakdown voltage characteristics due to electric field concentration in the corner areas of the oxide film.

In addition, the thin thickness in the bottom corner areas of an oxide film (e.g., $SiO_2$) grown by thermal oxidation in the deep trench can be compensated for while relatively flattening widthwise inner sidewalls of the deep trench, thereby improving the breakdown voltage characteristics and gap-fill characteristics of a device.

Meanwhile, the effects of the present disclosure are not limited to the effects described above and other effects not stated directly could be understood from the following description and claims.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, exemplary embodiments of the present disclosure will be described in more detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those ordinarily skilled in the art.

While the terms "first", "second", etc. may be used herein to describe various items such as various elements, regions and/or parts, these items should not be limited by these terms.

When a certain embodiment may be implemented differently, a specific process order may be performed differently from the described order. For example, two consecutively described processes may be performed substantially at the same time or performed in an order opposite to the described order.

Figure 2:
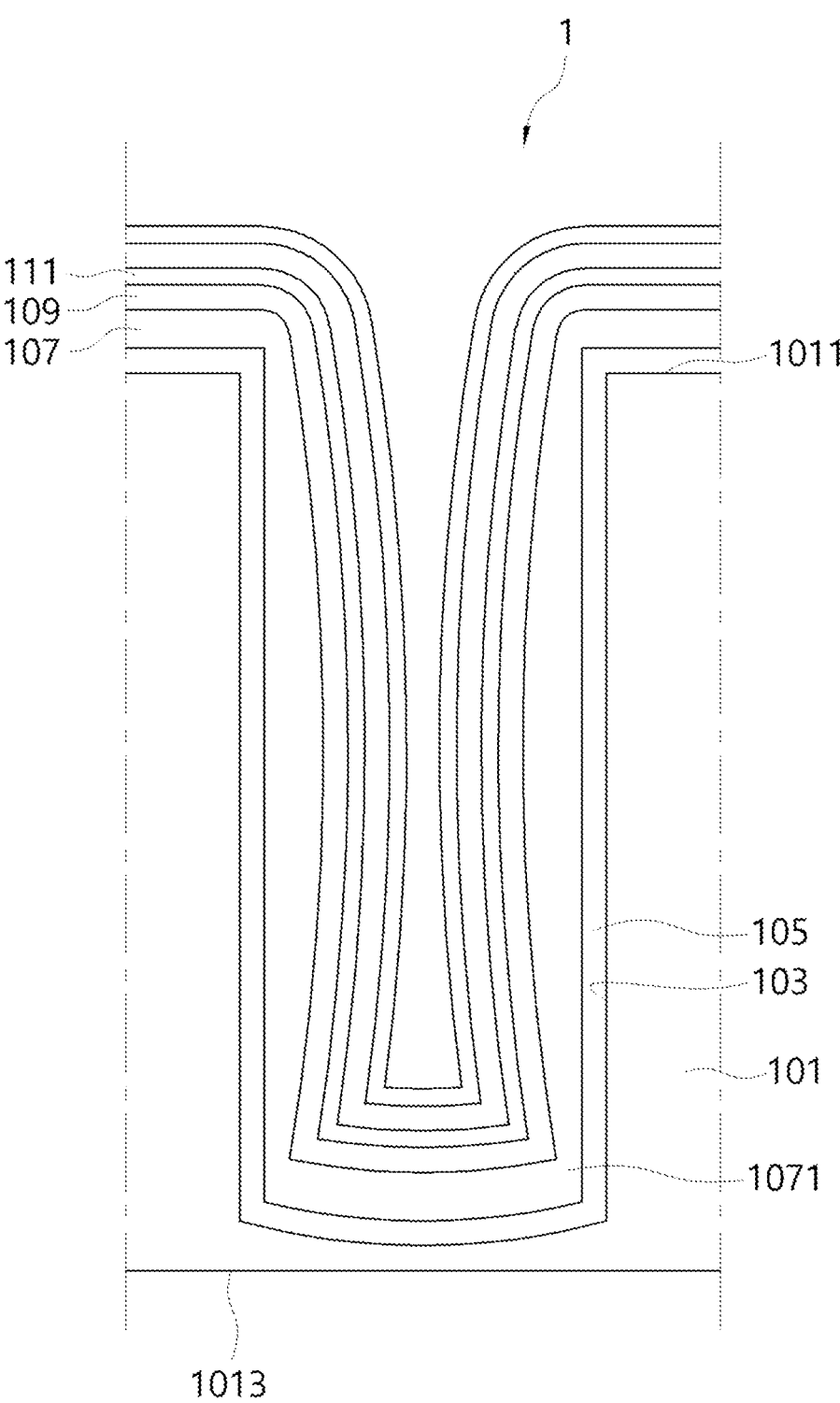
FIG. 2 is a sectional view illustrating a deep trench capacitor according to a first embodiment of the present disclosure.

FIG. 2 is a sectional view illustrating a deep trench capacitor 1 according to a first embodiment of the present disclosure.

Hereinafter, the deep trench capacitor 1 according to the first embodiment of the present disclosure will be described in detail with reference to the accompanying drawings.

Referring to FIG. 2, the present disclosure relates to the deep trench capacitor 1 and, more particularly to, the deep trench capacitor 1 that compensates for a thin thickness in bottom corner areas of an oxide film (e.g., $SiO_2$) grown by thermal oxidation in a deep trench, thereby preventing a deterioration in breakdown voltage characteristics due to electric field concentration in the corner areas of the oxide film.

In the deep trench capacitor 1 according to the first embodiment of the present disclosure, a substrate 101 having a first surface 1011 and a second surface 1013 is formed. The substrate 101 may be formed at least partially from silicon. A deep trench 103 having a predetermined depth is formed in the substrate 101. The deep trench 103 may be formed to have the predetermined depth from a first surface 1011 toward the second surface 103 of the substrate 101, and may be formed, for example, by a reactive ion etching (RIE) process. The depth of the deep trench 103 is preferably about 4 μm to 40 μm from the first surface 1011 of the substrate 101, but the present disclosure is not particularly limited thereto. In addition, the deep trench 103 may extend with a substantially uniform width from the first surface 1011 toward the second surface 1013 of the substrate 101.

Figure 3:
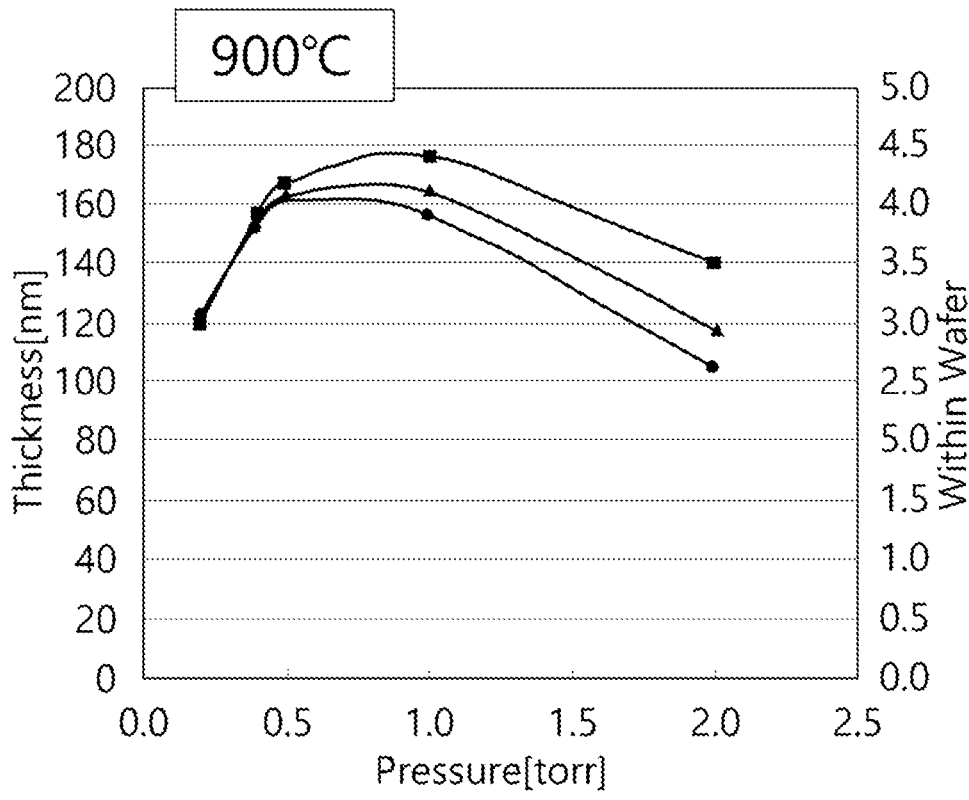
FIG. 3 is a graph illustrating a low-pressure radical oxidation process.

FIG. 3 is a graph illustrating a low-pressure radical oxidation process.

In addition, a compensation film 105 is formed on the first surface 1011 of the substrate 101 and on inner sidewalls and a bottom surface of the deep trench 103. The compensation film 105 may be formed by a low-pressure radical oxidation (LPRO) process. That is, the compensation film 105 may be, for example, an oxide film. The low-pressure radical oxidation process is preferably performed, for example, at a temperature of 900° C. and a pressure of 0.5 torr. In addition, the duration time of the oxidation process may be about 60 minutes, and the total flow rate of $H_2$ and $O_2$ may be 1800 cc. Referring to FIG. 3, it can be seen that sidewalls, a bottom surface, and corner areas of the compensation film 105 are all deposited substantially conformally under the conditions of a temperature of 900° C. and a pressure of 0.5 torr. In FIG. 3, it is understood that the curve with circle symbols represents the thickness of the sidewalls of the compensation film 105, the curve with square symbols represents the thickness of the bottom surface thereof, and the curve with triangle symbols represents the thickness of the corner areas thereof.

As can be seen from the results shown in the graph of FIG. 3, when the compensation film 105 is formed by performing the radical oxidation process under specific conditions, the compensation film 105 is hardly affected by the orientation of a crystal plane. Here, the compensation film 105 is preferably formed conformally to have a thickness of about 20 angstroms (Å) to about 160 Å, and more preferably 20 Å to 100 Å. However, it should be noted that the scope of the present disclosure is not limited by the above numerical range. The compensation film 105 is a film to compensate for the relatively thin thickness in corner areas 1071 of an oxide film 107, which will be described later.

Referring to FIG. 2, the oxide film 107 is formed on the compensation film 105. The oxide film 107 is formed on the compensation film 105 formed along inner walls of the deep trench 103. The oxide film 107 may be, for example, an $SiO_2$ film and may be grown by a thermal oxidation process. A bottom surface of the oxide film 107 is formed on the bottom surface of the compensation film 105, and the corner areas 1071 of the oxide film 107 are grown to a relatively thin thickness. In addition, the oxide film 107 is preferably formed to have a thickness of 100 Å to 500 Å. Alternatively, the oxide film 107 is preferably formed to have a thickness of 4 to 6 times that of the compensation film 105. When the thickness of the oxide film 107 is less than 4 times the thickness of the compensation film 105, the isolation effect from the substrate 101 is reduced. When the thickness of the oxide film 107 exceeds 6 times the thickness of the compensation film 105, the area of the deep trench 103 becomes small, making it difficult to secure capacitor characteristics (breakdown voltage characteristics, capacitance, leakage current, etc.)

Hereinafter, the formation process and structure of an oxide film 910 in a conventional deep trench capacitor 9 will be described in detail with reference to the accompanying drawings.

Figure 1:
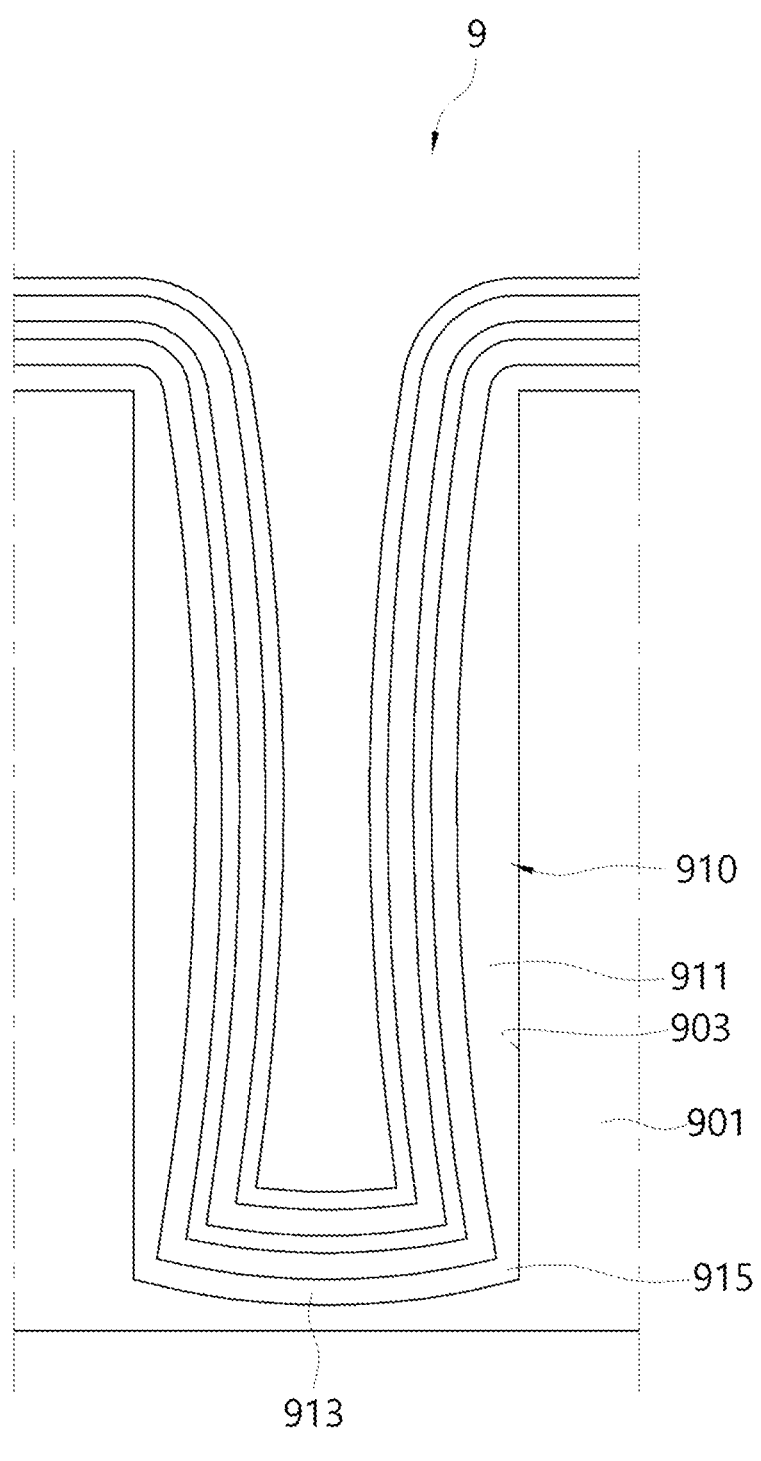
FIG. 1 is a reference diagram illustrating a conventional deep trench capacitor.

Referring to FIG. 1, in the manufacturing process of the conventional deep trench capacitor 9, $O_2$ diffuses toward an Si substrate 901 by a thermal oxidation process to form an $SiO_2$ oxide film of in a deep trench 903. Here, the growth rate of the oxide film 910 varies depending on the crystal direction. In detail, the oxide film 910 may be formed such that in the deep trench 903, sidewalls 911 thereof grow relatively quickly to be formed thick and a bottom surface 913 thereof grows more slowly than the sidewalls 911 to be formed relatively thin. In addition, corner areas 915 of the oxide film 910 where the sidewalls 911 and the bottom surface 913 meet generally grow the slowest to be formed the thinnest. As a result, inner walls of the corner areas 915 of the oxide film 910 are formed in a sharp shape. Due to such a thin thickness of the bottom surface 913 and the corner areas 915 of the oxide film 910, an electric field may be concentrated in the corner areas 915, causing a problem of deteriorating breakdown voltage characteristics.

Referring to FIG. 2, in order to solve the above problem, in one embodiment of the present disclosure, a substantially conformal compensation film 105 is formed on the inner walls of the deep trench 103 before forming the oxide film 107 by a thermal oxidation process.

Thereafter, a conductive layer 109 and a dielectric layer 111 may be repeatedly deposited within the deep trench 103 and on the oxide film 107. Both the conductive layer 109 and the dielectric layer 111 may be formed substantially conformally. In addition, the conductive layer 109 may be made of, for example, TiN, TaN, W, Poly Si, or the like. The dielectric layer 111 functions as a capacitor dielectric and may be made of $Al_2O_3$, $Ta_2O_5$, or the like. The dielectric layer 111 may be formed by, for example, an atomic layer deposition (ALD) process. However, it should be noted that the scope of the present disclosure is not limited by the examples described above. In FIG. 2, it is illustrated that two conductive layers 109 and two dielectric layers 111 are alternately formed in a total of four layers to form an empty space inside the deep trench 103. However, the conductive layer 109 and the dielectric layer 111 may be additionally formed, and the present disclosure is not particularly limited thereto.

In addition, the compensation film 105, the oxide film 107, the conductive layer 109, and the dielectric layer 111 deposited on the substrate 101 may be removed, or maintained as illustrated in FIG. 2, and the present disclosure is not particularly limited thereto.

FIGS. 4 to 7 are sectional views illustrating a method of manufacturing a deep trench capacitor 1 according to the first embodiment of the present disclosure.

Hereinafter, the method of manufacturing the deep trench capacitor 1 according to the first embodiment of the present disclosure will be described in detail with reference to the accompanying drawings.

Figure 4:
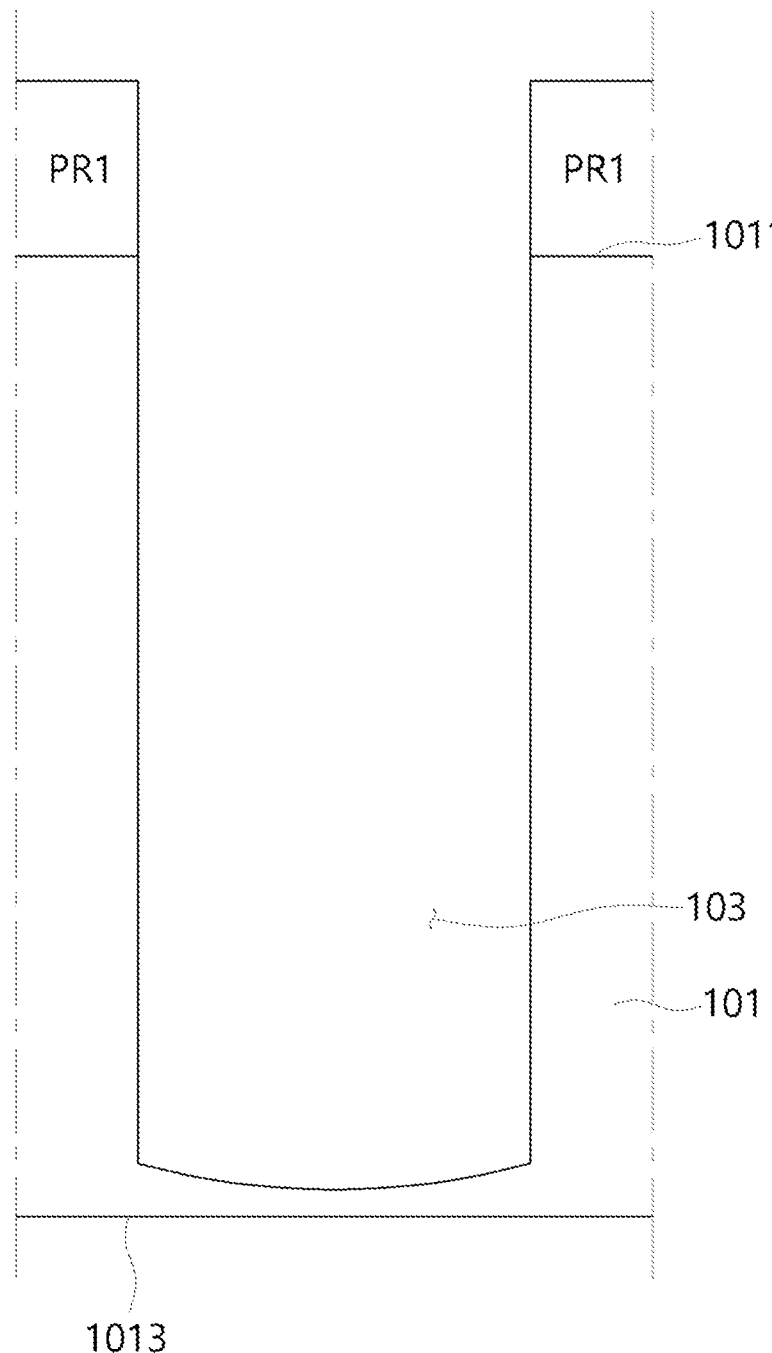
FIGS. 4 to 7 are sectional views illustrating a method of manufacturing a deep trench capacitor according to the first embodiment of the present disclosure.

Referring to FIG. 4, first, a deep trench 103 is formed in a substrate 101. The deep trench 103 may be formed by forming a mask pattern PR1 on the substrate 101 and then performing an etching process. After the etching process is completed, the mask pattern PR1 may be removed by a strip process.

Figure 5:
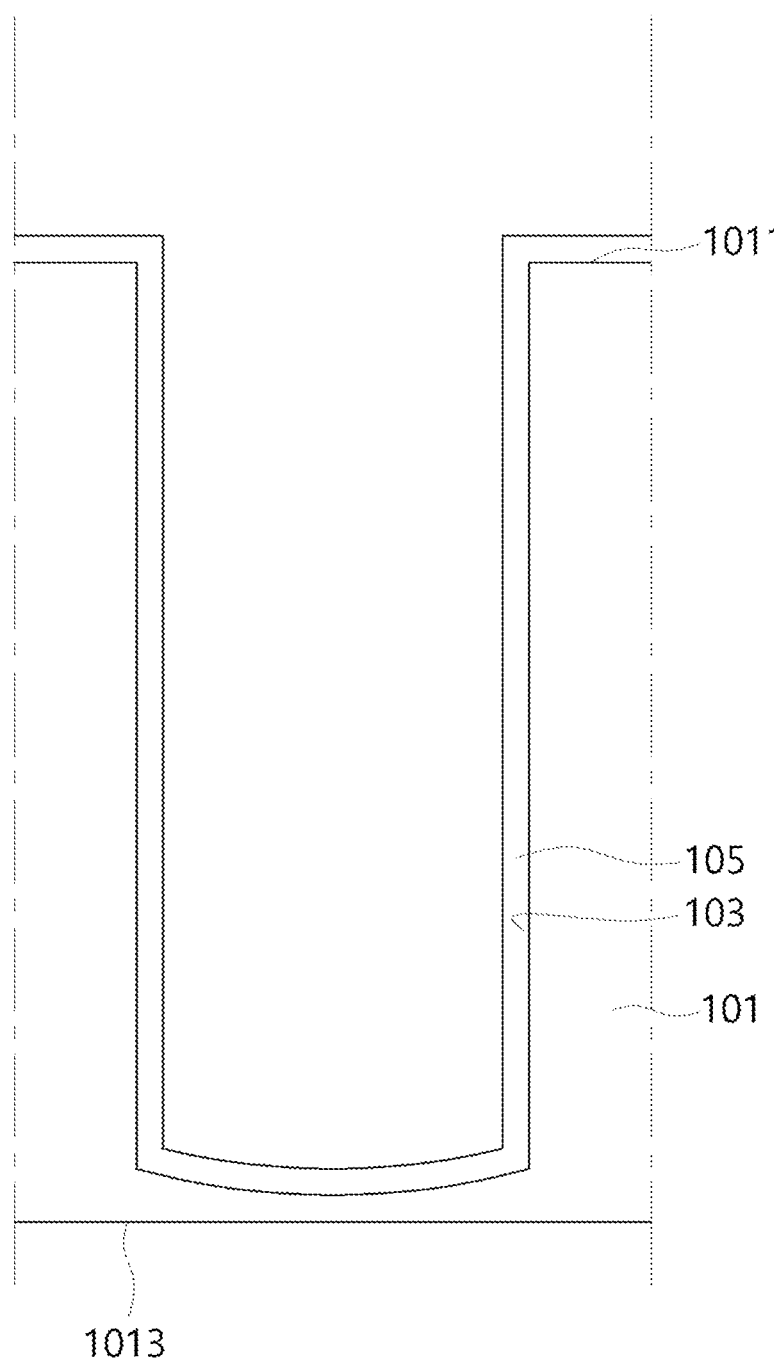

Then, referring to FIG. 5, a compensation film 105 is formed along inner walls of the deep trench 103. As described above, the compensation film 105 may be formed by a low-pressure radical oxidation process. Here, the compensation film 105 may be formed substantially conformally, and preferably has a thickness of about 20 Å to about 100 Å.

Figure 6:
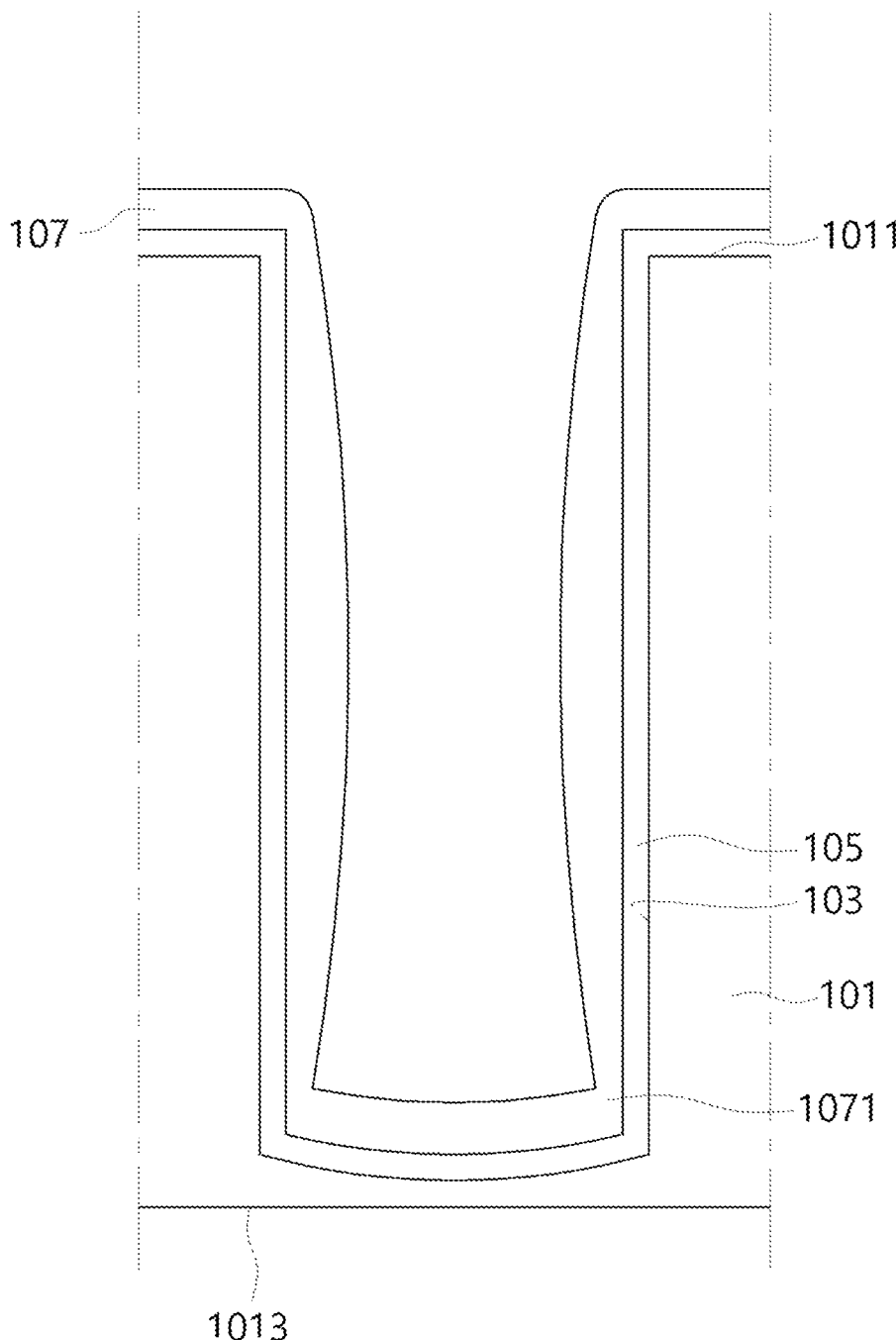

Then, referring to FIG. 6, an oxide film 107 is formed on the compensation film 105. The oxide film 107 may be formed by a thermal oxidation process. The oxide film 107 preferably has a thickness of about 100 Å to 500 Å, or a thickness of 4 to 6 times that of the compensation film 105. In addition, corner areas 1071 of the oxide film 107 have a relatively thin thickness due to the nature of the thermal oxidation process in which the growth rate varies depending on the crystal direction. However, the overall thickness is compensated by the compensation film 105, so that breakdown voltage characteristics can be prevented from being deteriorated.

Figure 7:
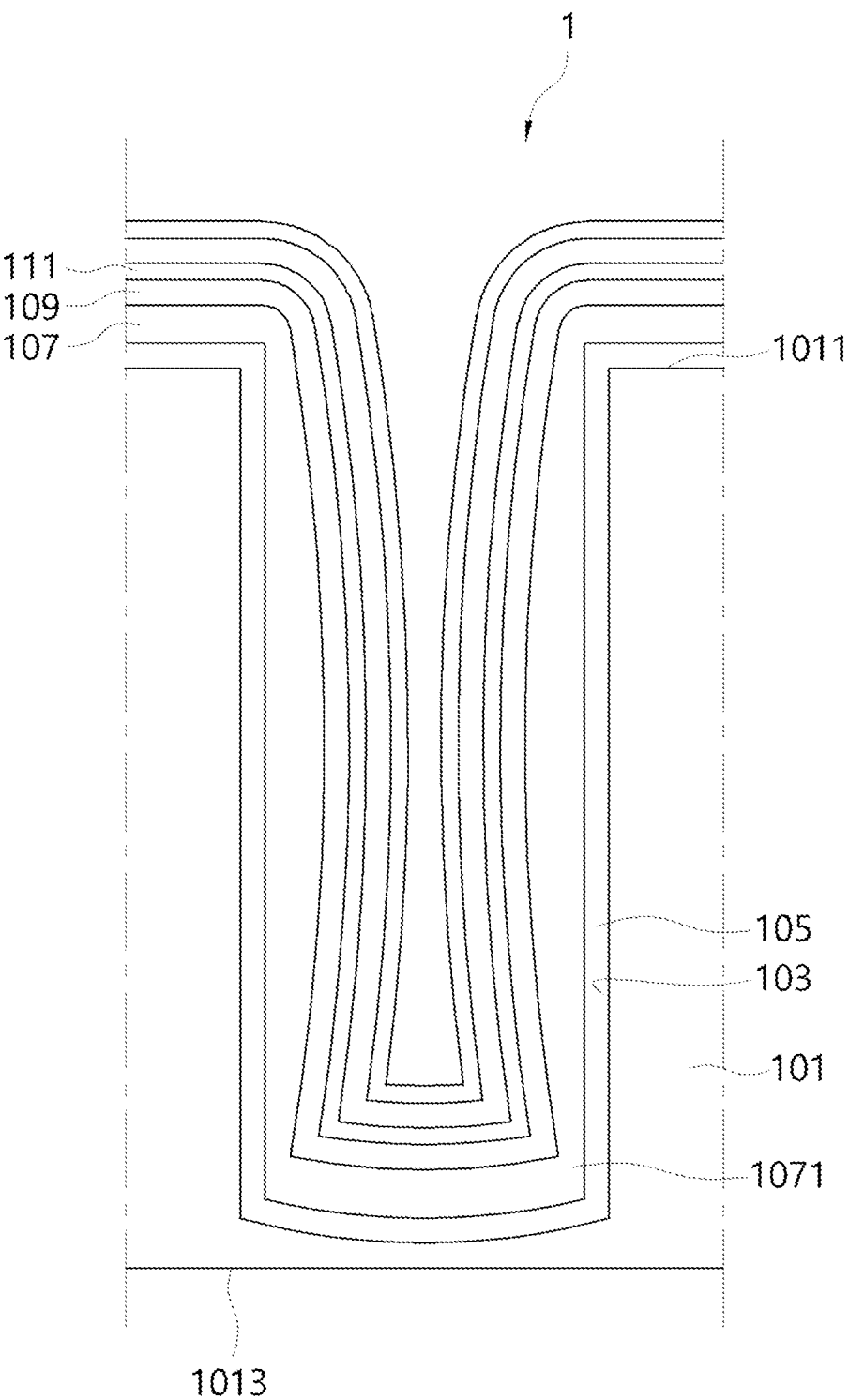

Next, referring to FIG. 7, after the oxide film 107 is formed, a conductive layer 109 and a dielectric layer 111 are alternately formed in the deep trench 103 and on the oxide film 107. Here, both the conductive layer 109 and the dielectric layer 111 may be formed substantially conformally. Both the conductive layer 109 and the dielectric layer 111 may be formed by an ALD process, but the present disclosure is not particularly limited thereto.

Figure 8:
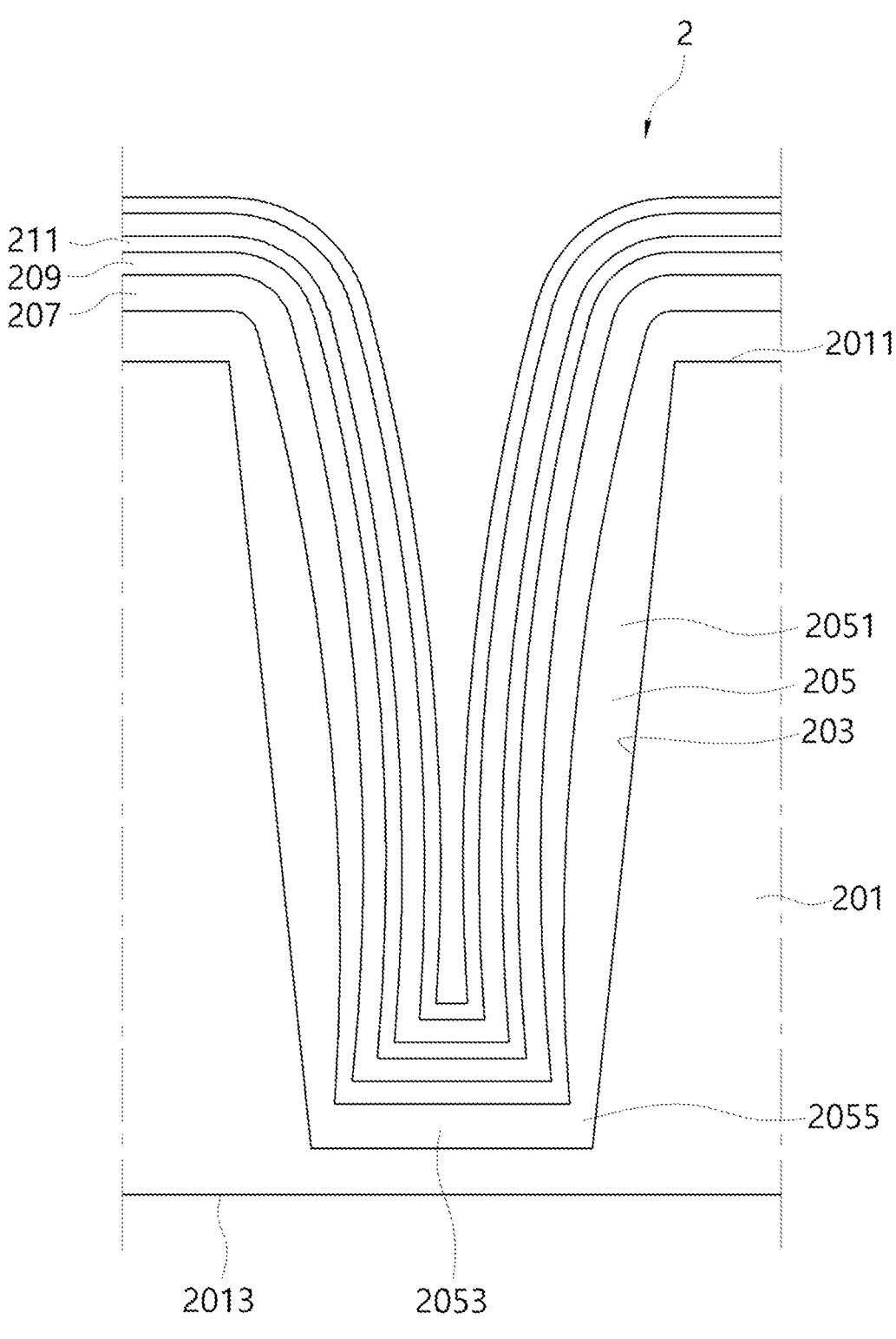
FIG. 8 is a sectional view illustrating a deep trench capacitor according to a second embodiment of the present disclosure.

FIG. 8 is a sectional view illustrating a deep trench capacitor 2 according to a second embodiment of the present disclosure.

Hereinafter, the deep trench capacitor 2 according to the second embodiment of the present disclosure will be described in detail with reference to the accompanying drawings.

Referring to FIG. 8, the present disclosure relates to the deep trench capacitor 2 and, more particularly to, the deep trench capacitor 2 that compensates for a thin thickness in bottom corner areas of an oxide film (e.g., $SiO_2$) grown by thermal oxidation in a deep trench while relatively flattening widthwise inner sidewalls of the deep trench, thereby improving the breakdown voltage characteristics and gap-fill characteristics of a device.

In the deep trench capacitor 2 according to the first embodiment of the present disclosure, a substrate 201 having a first surface 2011 and a second surface 2013 is formed. The substrate 201 may be formed at least partially from silicon. A deep trench 203 having a predetermined depth is formed in the substrate 201. Like the deep trench 103 according to the first embodiment, the deep trench 203 may be formed by, for example, an RIE process. The deep trench 203 preferably has a wider width than the deep trench 103. Here, unlike the deep trench 103 according to the first embodiment, the deep trench 203 may be formed such that inner sidewalls thereof are inclined as extending from the first surface 2011 toward the second surface 2013 of the substrate 201. That is, the deep trench 203 narrows in width as extending downwardly.

An oxide film 205 is formed on the substrate 201 and on the inner walls of the deep trench 203. The oxide film 205 may be grown by a thermal oxidation process. It is understood that the oxide film 205 is substantially the same as the oxide film 107 according to the first embodiment. Thus, the oxide film 205 is preferably formed to have a thickness of 100 Å to 500 Å, and has a relatively thin thickness in corner areas 2055.

In more detail, sidewalls 2051 of the oxide film 205 are formed to be the thickest, and a bottom surface 2053 thereof is formed to be thinner than the sidewalls 2051. In addition, the corner areas 2055 of the oxide film 205 where the sidewalls 2051 and the bottom surface 2053 meet are formed to be the thinnest.

As described above, since the inner sidewalls of the deep trench 203 are inclined to narrow downwardly, upper portions of the open inner sidewalls of the deep trench 203 (or the inner sidewalls of the oxide film 205) have a wider width than lower portions thereof even after the oxide film 205 is formed. In this state, when a conductive layer 209 and a dielectric layer 211 are conformally deposited in the subsequent process, the lower portions of the open inner sidewalls of the deep trench 203 may be completely filled first compared to the upper portions thereof. Thus, gap-filling of the upper portions of the open inner sidewalls of the deep trench 203 is relatively difficult. In some cases, an undesired air gap may be formed larger than necessary inside the deep trench capacitor 2.

In order to prevent the above problem, the deep trench capacitor 2 according to the second embodiment of the present disclosure is characterized by forming a planarization film 207 on the oxide film 205 in the deep trench 203. The planarization film 207 does not function to make the open inner sidewalls of the deep trench 203 perpendicular to the first surface 2011, and is preferably understood as a configuration that alleviates the inclination. That is, inner sidewalls of the planarization film 207 have an inclination angle between an inclination angle of the inner sidewalls of the deep trench 203 and an angle of 90° (or perpendicular to the first surface 2011).

To this end, the planarization film 207 is preferably, for example, a tetra ethylene ortho silicate (TEOS) film, and more preferably a low pressure-tetra ethylene ortho silicate (LP-TEOS film) or a plasma enhanced-tetra ethylene ortho silicate (PE-TEOS) film. The planarization film 207 made of such an LP-TEOS film or PE-TEOS film has relatively low step coverage characteristics compared to the compensation film 105 obtained by the low-pressure radical oxidation process according to the first embodiment. That is, the planarization film 207 may be formed such that in the deep trench 203, upper portions of the sidewalls thereof are thicker than lower portions thereof. Thus, the inclination of the sidewalls 2051 of the oxide film 205 can be alleviated. The planarization film 207 may be formed to have an overall thickness of, for example, 200 Å to 1500 Å.

The conductive layer 209 and the dielectric layer 211 are alternately deposited on the planarization film 207. The conductive layer 209 and the dielectric layer 211 are substantially the same as the conductive layer 109 and the dielectric layer 111 according to the first embodiment, and thus a detailed description thereof will be omitted.

In FIG. 8, it is illustrated that two conductive layers 209 and two dielectric layers 211 are alternately formed in a total of four layers to form an empty space inside the deep trench 203. However, the conductive layer 209 and the dielectric layer 211 may be additionally formed, and the present disclosure is not particularly limited thereto.

In addition, the oxide film 205, the planarization film 207, the conductive layer 209, and the dielectric layer 211 deposited on the substrate 201 may be removed, or maintained as illustrated in FIG. 8, and the present disclosure is not particularly limited thereto.

FIGS. 9 to 12 are sectional views illustrating a method of manufacturing a deep trench capacitor 2 according to the second embodiment of the present disclosure.

Hereinafter, the method of manufacturing the deep trench capacitor 2 according to the first embodiment of the present disclosure will be described in detail with reference to the accompanying drawings.

Figure 9:
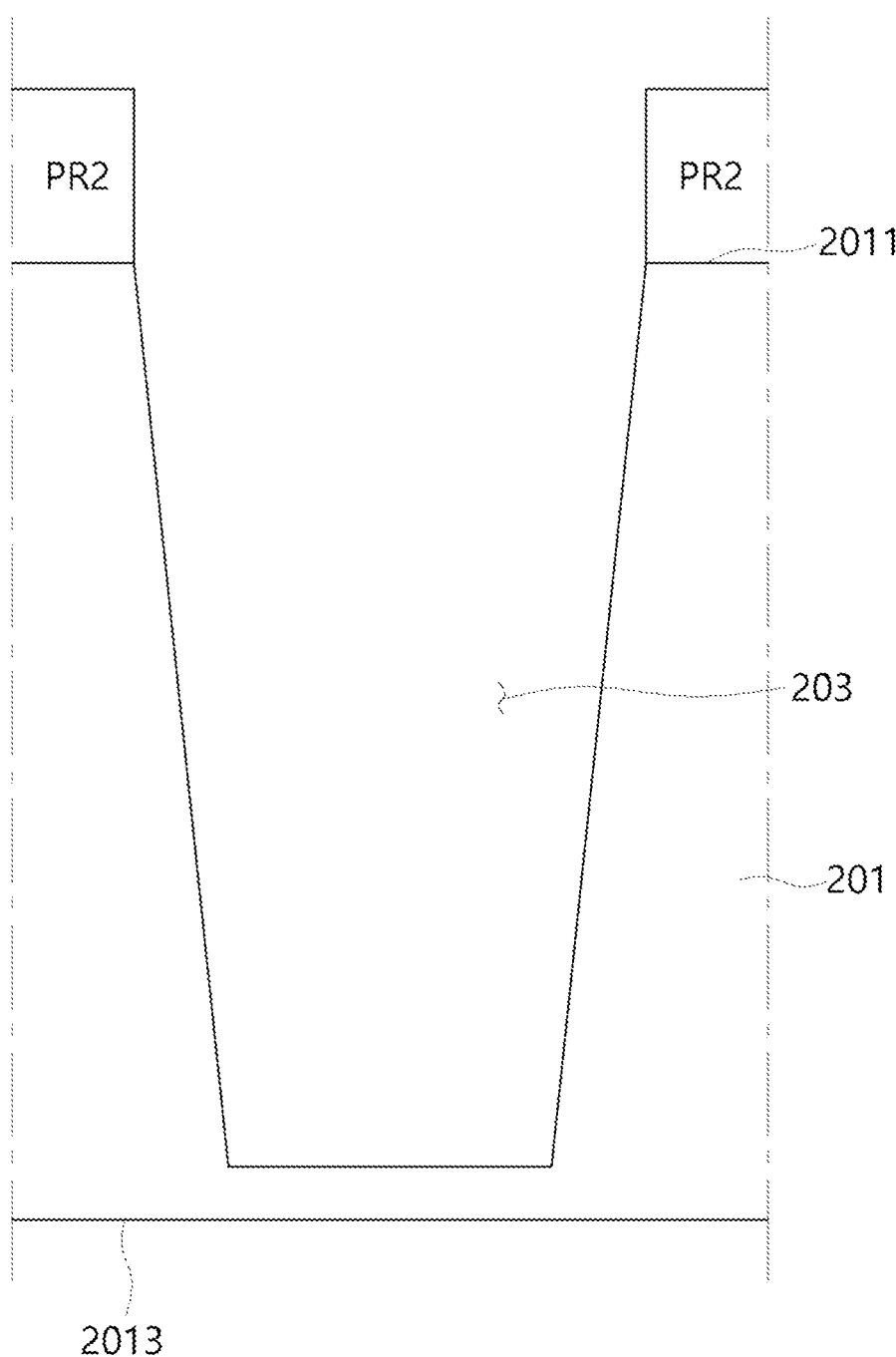
FIGS. 9 to 12 are sectional views illustrating a method of manufacturing a deep trench capacitor according to the second embodiment of the present disclosure.

Referring to FIG. 9, first, a deep trench 203 is formed in a substrate 201. The deep trench 203 may be formed by forming a mask pattern PR2 on the substrate 201 and then performing an etching process. After the etching process is completed, the mask pattern PR2 may be removed by a strip process.

Figure 10:
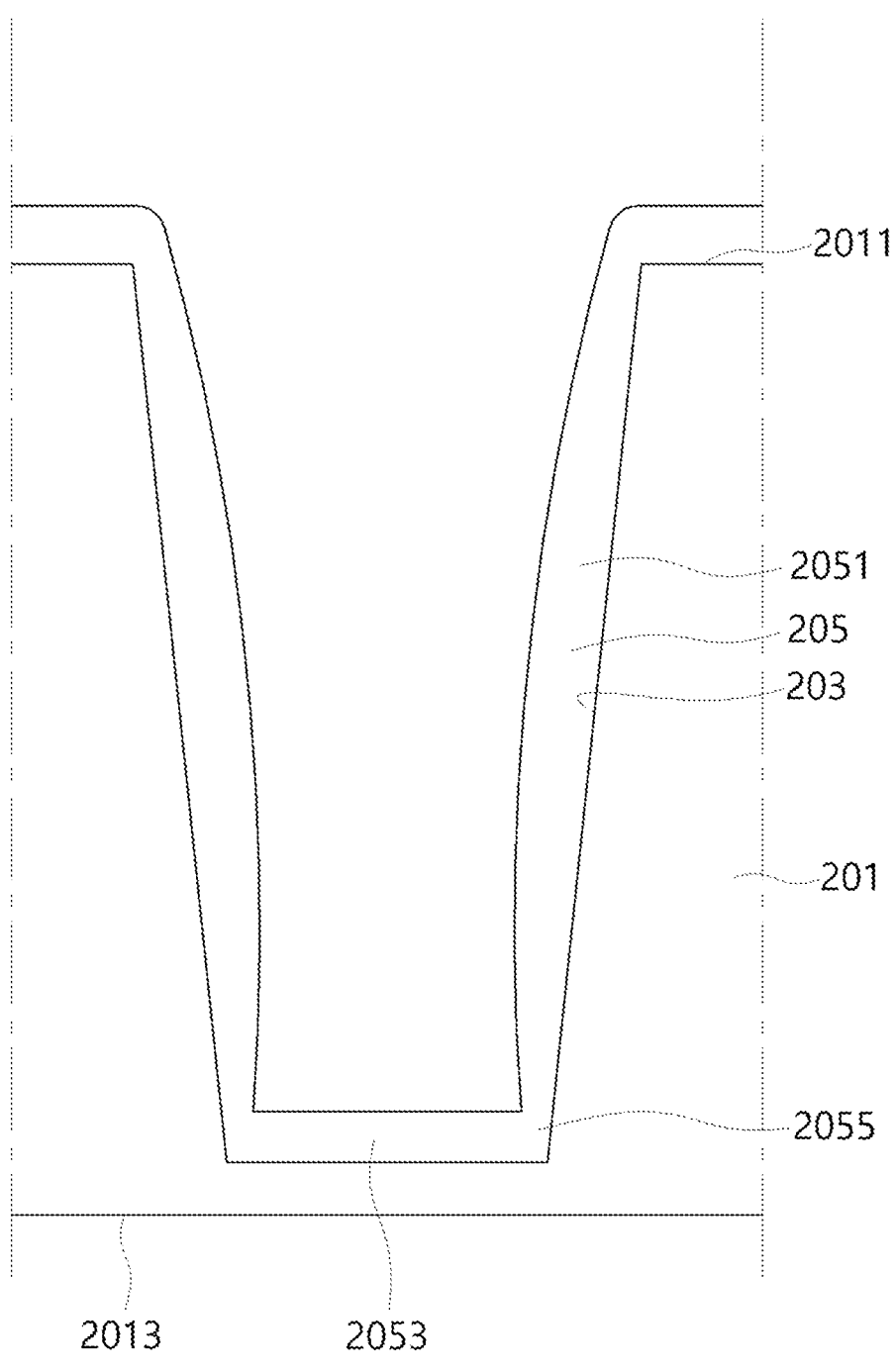

Then, referring to FIG. 10, an oxide film 205 is formed along inner walls of the deep trench 203. The oxide film 205 may be formed by a thermal oxidation process. The oxide film 205 preferably has a thickness of about 100 Å to about 500 Å. As described above, sidewalls 2051 of the oxide film 205 are conformally formed to be the thickest, and a bottom surface 2053 thereof is conformally formed to be thinner than the sidewalls 2051. In addition, corner areas 2055 of the oxide film 205 where the sidewalls 2051 and the bottom surface 2053 meet are formed to be the thinnest.

Figure 11:
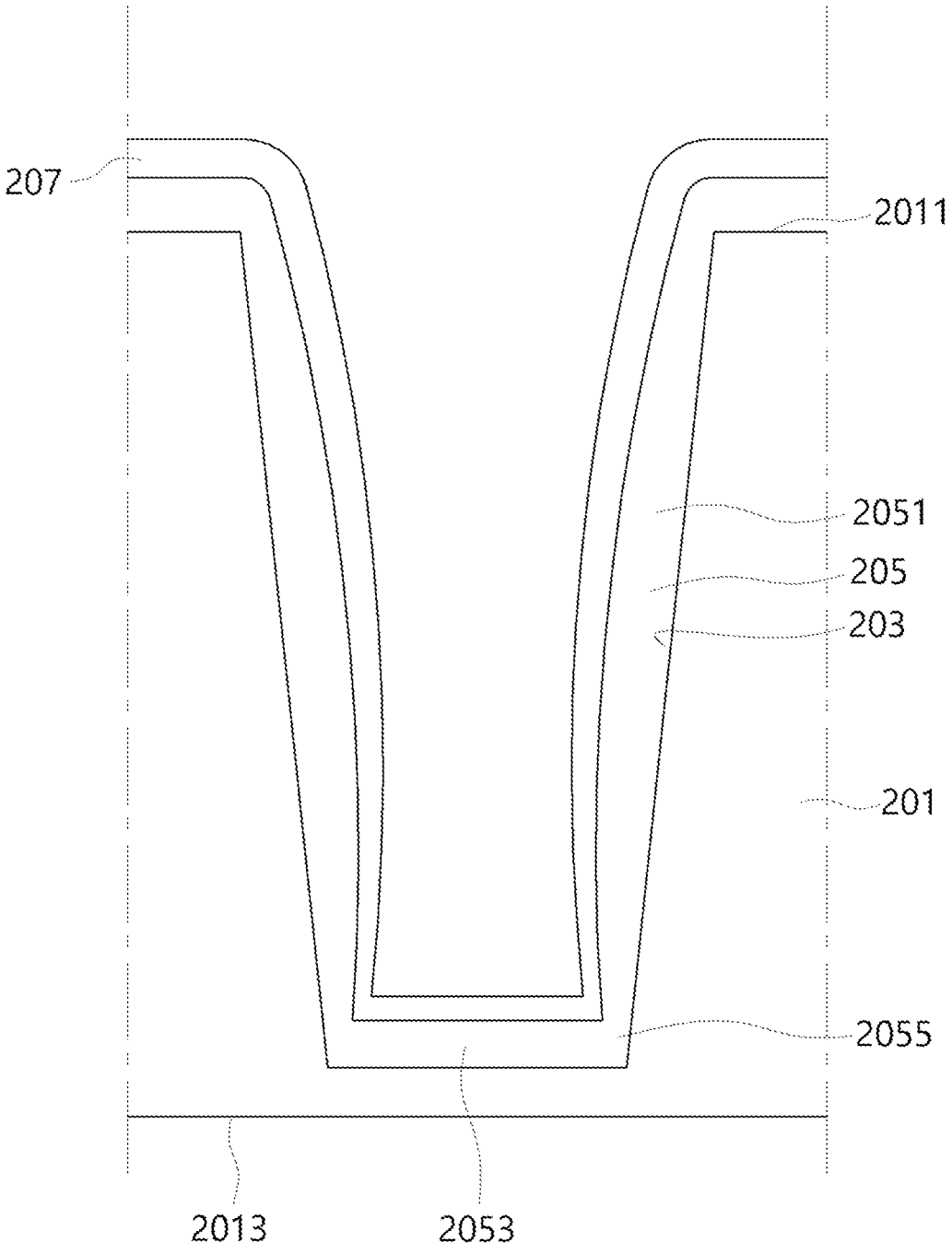

Referring to FIG. 11, after the oxide film 205 is formed, a planarization film 207 is formed on the oxide film 205. As described above, the planarization film 207 is preferably, for example, a TEOS film, and more preferably an LP-TEOS film or a PE-TEOS film.

Figure 12:
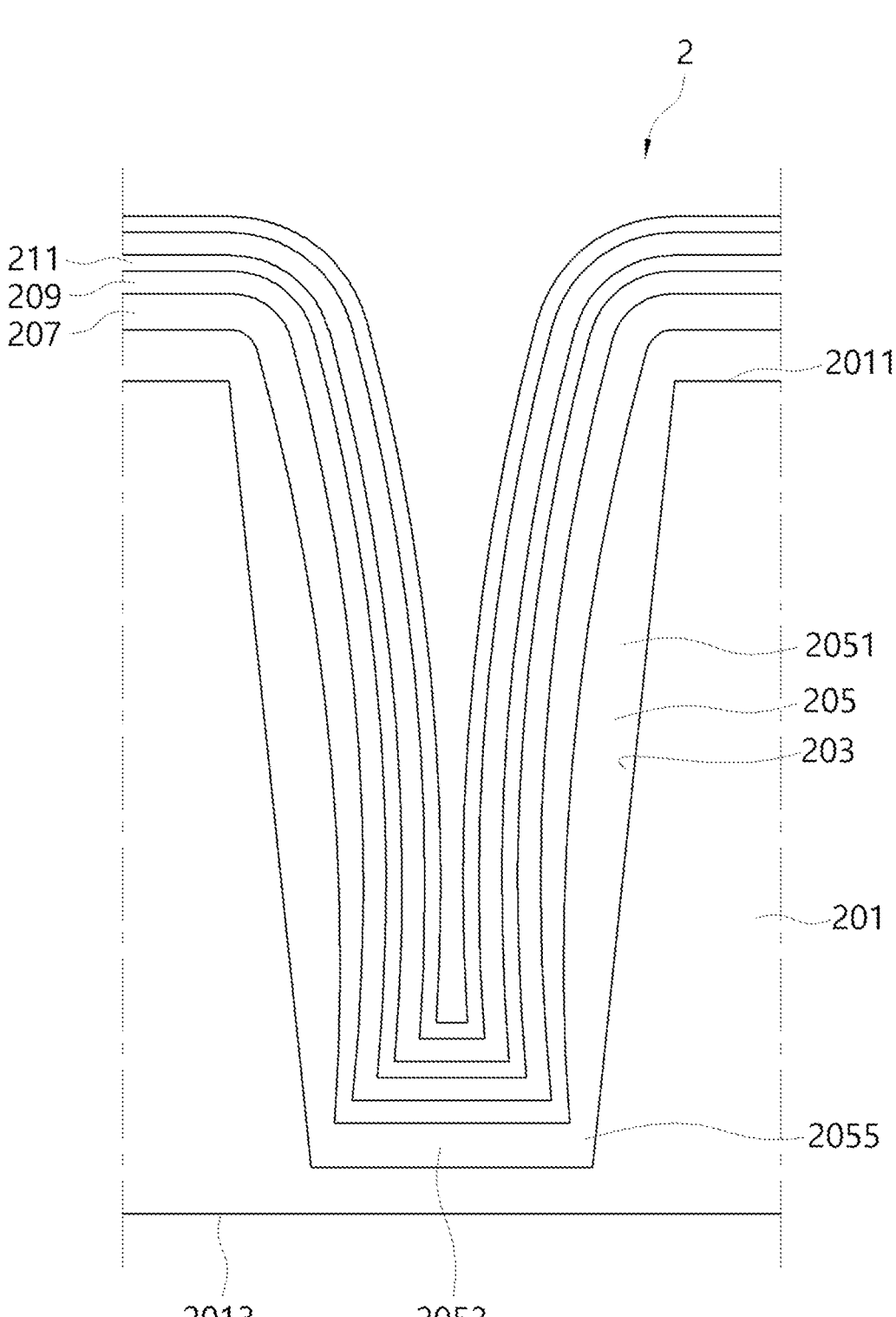

Then, referring to FIG. 12, a conductive layer 209 and a dielectric layer 211 are alternately deposited on the planarization film 207. Here, both the conductive layer 209 and the dielectric layer 211 may be formed substantially conformally. Both the conductive layer 209 and the dielectric layer 211 may be formed by an ALD process, but the present disclosure is not particularly limited thereto.

Figure 13:
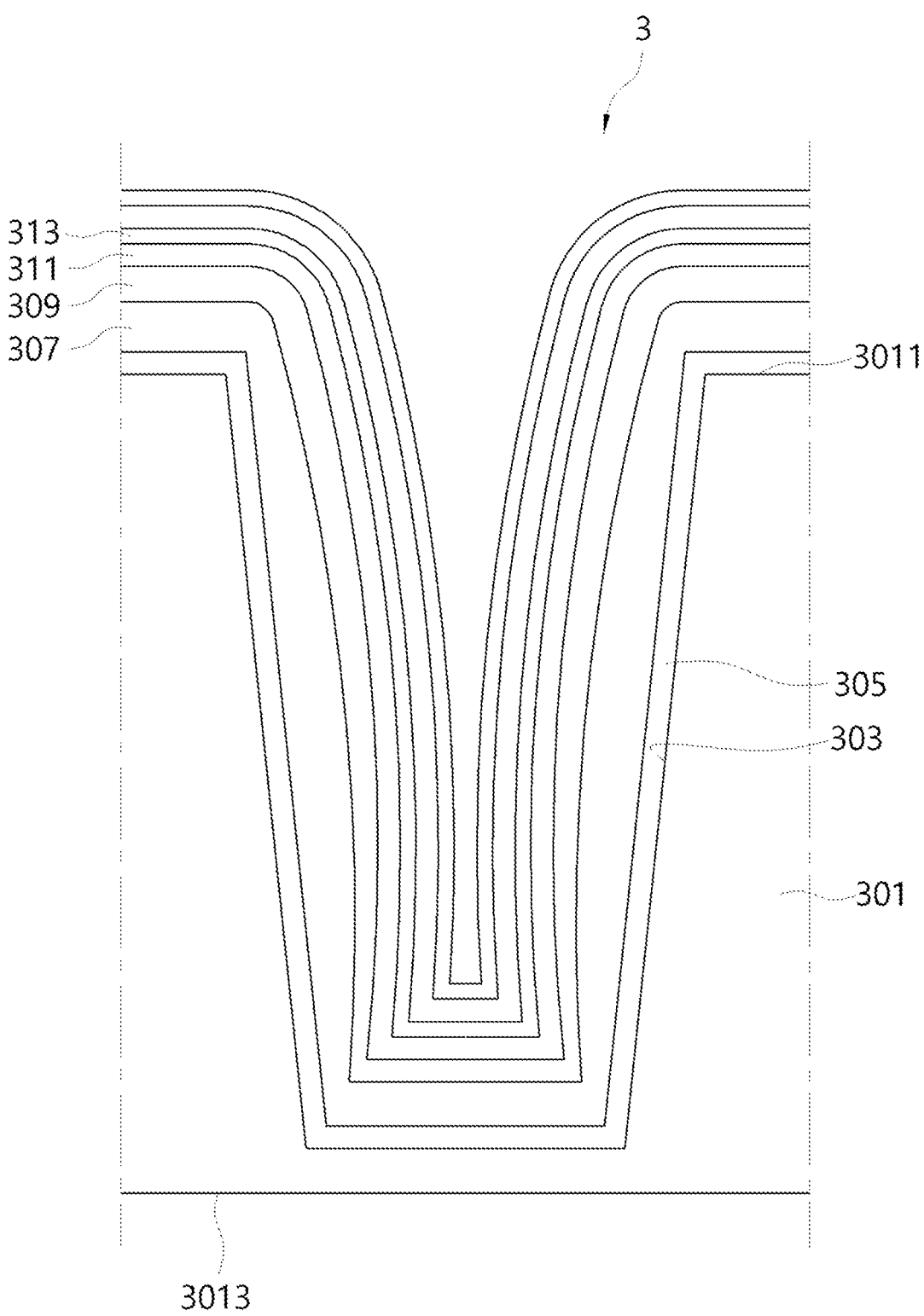
FIG. 13 is a sectional view illustrating a deep trench capacitor according to a third embodiment of the present disclosure.

FIG. 13 is a sectional view illustrating a deep trench capacitor 3 according to a third embodiment of the present disclosure.

Hereinafter, the deep trench capacitor 3 according to the third embodiment of the present disclosure will be described in detail with reference to the accompanying drawings. The deep trench capacitor 3 according to the third embodiment of the present disclosure is a combination of the deep trench capacitors 1 and 2 according to the first and second embodiments. Thus, a detailed description of each configuration will be omitted.

Referring to FIG. 13, in the deep trench capacitor 3 according to the third embodiment of the present disclosure, a substrate 301 having a first surface 3011 and a second surface 3013 is formed. The substrate 301 may be formed at least partially from silicon. A deep trench 303 having a predetermined depth is formed in the substrate 301. Like the deep trenches 103 and 203 according to the first and second embodiments, the deep trench 303 may be formed by, for example, an RIE process. The deep trench 303 preferably has a wider width than the deep trench 103. Here, unlike the deep trench 203 according to the second embodiment, the deep trench 303 may be formed such that inner sidewalls thereof are inclined as extending from the first surface 3011 toward the second surface 3013 of the substrate 301. That is, the deep trench 303 narrows in width as extending downwardly.

A compensation film 305 and an oxide film 307 on the compensation film 305 are formed on inner walls of the deep trench 303. The compensation film 305 and the oxide film 307 may be substantially the same as the compensation film 105 and the oxide film 107 according to the first embodiment.

A planarization film 309 is formed on the oxide film 307. The planarization film 309 may be substantially the same as the planarization film 207 according to the second embodiment. A conductive layer 311 and a dielectric layer 313 are alternately deposited on the planarization film 309. The conductive layer 311 and a dielectric layer 313 may be substantially the same as the conductive layer 109 and dielectric layer 111 according to the first embodiment.

In FIG. 13, it is illustrated that two conductive layers 311 and two dielectric layers 313 are alternately formed in a total of four layers to form an empty space inside the deep trench 303. However, the conductive layer 311 and the dielectric layer 313 may be additionally formed, and the present disclosure is not particularly limited thereto.

In addition, the compensation film 307, the oxide film 307, the planarization film 309, the conductive layer 311, and the dielectric layer 313 deposited on the substrate 301 may be removed, or maintained as illustrated in FIG. 13, and the present disclosure is not particularly limited thereto.

By the deep trench capacitor 3 according to the third embodiment, when the conductive layer 309 and the dielectric layer 313 are conformally deposited, lower portions of open inner sidewalls of the deep trench 303 can be prevented from being completely filled first compared to upper portions thereof, so that a gap-fill process can be easily performed. Also, electric field concentration can be prevented in corner areas of the oxide film 307, thereby preventing a deterioration in breakdown voltage characteristics.

The foregoing detailed description may be merely an example of the present disclosure. Also, the inventive concept is explained by describing the preferred embodiments and will be used through various combinations, modifications, and environments. That is, the inventive concept may be amended or modified without departing from the scope of the technical idea and/or knowledge in the art. The foregoing embodiments are for illustrating the best mode for implementing the technical idea of the present disclosure, and various modifications may be made therein according to specific application fields and uses of the present disclosure. Therefore, the foregoing detailed description of the present disclosure is not intended to limit the inventive concept to the disclosed embodiments.

What is claimed is:

1. A deep trench capacitor, comprising:
   a substrate having a first surface and a second surface opposite to the first surface;
   a trench having a predetermined depth in the substrate;
   a compensation film composed of an oxide layer and disposed on inner sidewalls and a bottom surface of the trench;
   an oxide film disposed on and contacting the compensation film; and
   a conductive layer and a dielectric layer alternately deposited on the oxide film,
   wherein the oxide film has corner areas having a thickness smaller than that of sidewalls and a bottom surface of the oxide film.

2. The deep trench capacitor of claim 1, wherein the oxide film is formed by a thermal oxidation process.

3. The deep trench capacitor of claim 2, wherein the compensation film is formed conformally.

4. The deep trench capacitor of claim 3, wherein the compensation film is formed conformally to have a thickness ranging from 20 Å to 160 Å.

5. The deep trench capacitor of claim 2, wherein the oxide film has a thickness ranging from 100 Å to 500 Å.

6. The deep trench capacitor of claim 1, wherein a thickness of the oxide film is 4 to 6 times a thickness of the compensation film.

7. A method of manufacturing the deep trench capacitor of claim 1, the method comprising:
   forming the trench having the predetermined depth in the substrate;
   forming the compensation film along inner walls of the trench;
   forming the oxide film on the compensation film; and
   forming the conductive layer and the dielectric layer alternately on the oxide film, wherein the compensation film is the oxide layer and formed conformally.

8. The method of claim 7, wherein the compensation film is formed by a low-pressure radical process.

9. The method of claim 8, wherein the oxide film is grown by a thermal oxidation process.

10. A deep trench capacitor, comprising:
a substrate having a first surface and a second surface opposite to the first surface;
a trench formed in the substrate and having inner side-walls that are inclined as extending downwardly;
an oxide film disposed on the inner sidewalls of the trench;
a planarization film disposed on the oxide film; and
a conductive layer and a dielectric layer alternately deposited on the planarization film,
wherein the planarization film is formed in the trench such that an upper portion thereof is thicker than a lower portion thereof, and planarization film extends continuously within the trench to be in contact with an entire inner wall of the oxide film.

11. The deep trench capacitor of claim 10, wherein the planarization film is a TEOS film.

12. The deep trench capacitor of claim 11, wherein the planarization film is an LP-TEOS film or a PE-TEOS film.

13. The deep trench capacitor of claim 11, wherein the planarization film has an overall thickness ranging from 200 Å to 1500 Å.

14. The deep trench capacitor of claim 11, wherein inner sidewalls of the planarization film have an inclination angle between an inclination angle of the inner sidewalls of the trench and an angle of 90°.

15. A deep trench capacitor, comprising:
a substrate having a first surface and a second surface opposite to the first surface;
a trench having a predetermined depth in the substrate;
a compensation film disposed on inner sidewalls and a bottom surface of the trench;
an oxide film disposed on the compensation film;
a planarization film disposed on the oxide film; and
a conductive layer and a dielectric layer alternately deposited on the planarization film.

16. The deep trench capacitor of claim 15, wherein the compensation film is formed by a low-pressure radical process at a pressure of 0.5 torr.

17. The deep trench capacitor of claim 15, wherein the compensation film is an oxide layer and is not substantially affected by orientation of a crystal plane.

18. The deep trench capacitor of claim 17, wherein the oxide film is formed such that in the trench, a thickness of sidewalls thereof is greater than a thickness of the bottom surface and corner areas thereof, the bottom surface thereof is thinner than the sidewalls, and the corner areas thereof where the sidewalls and the bottom surface meet have a thickness smaller than the thickness of the bottom surface.

19. The deep trench capacitor of claim 18, wherein the planarization film is an LP-TEOS film or a PE-TEOS film.

* * * * *